United States Patent [19]
Kimura et al.

[11] Patent Number: 5,790,577
[45] Date of Patent: Aug. 4, 1998

[54] HIGH OUTPUT SEMICONDUCTOR LASER ELEMENT HAVING ROBUST ELECTRODE STRUCTURE

[75] Inventors: Yuji Kimura, Nagoya; Kinya Atsumi, Okazaki; Katsunori Abe, Chita-gun; Tetsuo Toyama, Chiryu, all of Japan

[73] Assignee: Nippondenso Co., Ltd., Kariya, Japan

[21] Appl. No.: 722,679

[22] Filed: Sep. 30, 1996

[30] Foreign Application Priority Data

Oct. 5, 1995 [JP] Japan ................................ 7-259104
May 31, 1996 [JP] Japan ................................ 8-138540

[51] Int. Cl.$^6$ ................................ H01S 3/18; H01S 3/19
[52] U.S. Cl. ................................ 372/43; 372/44; 372/46
[58] Field of Search ................................ 372/45, 46, 50, 372/43, 44, 70, 75, 49; 174/255; 347/204

[56] References Cited

U.S. PATENT DOCUMENTS

| | | | |
|---|---|---|---|
| 3,660,780 | 5/1972 | Iida et al. | 372/49 |
| 4,251,780 | 2/1981 | Scifres et al. | 372/46 |
| 4,574,292 | 3/1986 | Takikawa et al. | 347/204 |
| 4,956,682 | 9/1990 | Ohnaka et al. | 372/50 |
| 5,041,700 | 8/1991 | Iyogi et al. | 174/255 |
| 5,355,384 | 10/1994 | Inoue et al. | 372/46 |
| 5,559,819 | 9/1996 | Abe et al. | 372/46 |
| 5,604,761 | 2/1997 | Seki et al. | 372/43 |
| 5,623,509 | 4/1997 | Iwano et al. | 372/46 |
| 5,638,391 | 6/1997 | Shima et al. | 372/44 |
| 5,684,816 | 11/1997 | Takagi | 372/44 |

FOREIGN PATENT DOCUMENTS

| | | |
|---|---|---|
| 0 184 117 | 6/1986 | European Pat. Off. . |
| 0 222 395 | 5/1987 | European Pat. Off. . |
| 0 413 491 | 2/1991 | European Pat. Off. . |
| 56-029381 | 3/1981 | Japan . |
| 61-001083 | 1/1986 | Japan . |
| 61-005593 | 1/1986 | Japan . |
| 62-043556 | 9/1987 | Japan . |
| 62-276885 | 12/1987 | Japan . |
| 63-019892 | 1/1988 | Japan . |
| 64-061948 | 3/1989 | Japan . |
| 2-002646 | 1/1990 | Japan . |

OTHER PUBLICATIONS

Patent Abstracts of Japan, vol. 12, No. 167.
Patent Abstracts of Japan, vol. 1, No. 123.

*Primary Examiner*—Rodney B. Bovernick
*Assistant Examiner*—Quyen Phan Leung
*Attorney, Agent, or Firm*—Cushman Darby & Cushman IP Group of Pillsbury Madison & Sutro LLP

[57] ABSTRACT

A high-output semiconductor laser element has one of a Cr/Pt/Au electrode and Cr/Ni/Au electrode as a P-type electrode to provide an electrode construction that is robust with respect to heat, high in reliability and stable for a long period of time. The P-type electrode is disposed on an N-type substrate via an epitaxial layer and defines a stripe 41 having a width of 100 μm or more.

15 Claims, 4 Drawing Sheets

HIGH OUTPUT SEMICONDUCTOR LASER ELEMENT HAVING ROBUST ELECTRODE STRUCTURE

CROSS-REFERENCE TO RELATED APPLICATIONS

The present application is related to and claims priority from Japanese Patent Application Nos. Hei 7-259104 and Hei 8-138540, incorporated herein by reference.

BACKGROUND OF THE INVENTION

1. Field of the Invention

The present invention relates to a semiconductor laser element which is suitable for use in, for example, a high output semiconductor laser or integrated optical device.

2. Description of Related Art

Conventionally, this type of semiconductor laser element includes a two layer electrode that consists of Cr/Au as a P-type electrode formed on a GaAs substrate through an epitaxial layer. However, when the above-mentioned Cr/Au two-layer electrode has been heat treated after the formation thereof, deterioration occurs in this electrode. Therefore, Cr and Au are alloyed due to the deterioration, and Ga and As in the GaAs substrate diffuse into the electrode to thereby increase the resistance of this electrode. This is followed by the inconvenience that the Cr/Au two-layer electrode becomes unreliable at high temperatures.

As a countermeasure, Japanese Laid-Open Patent Publication No. Sho 62-276885 discloses that, two layers of Zn/Pt may be inserted between the layers of Cr and Au to prepare a P-type electrode that consists of four layers of Cr/Zn/Pt/Au. The Zn layer is inserted in order to enhance contact between the P-type electrode and the P-type semiconductor layer and thereby decrease the contact resistance. However, where the Zn layer is inserted in such a manner, the sheet resistance increases due to the reaction between the layers of Cr and Zn, with the result that the resistance of the entire electrode increases inconveniently.

Also, as disclosed in Japanese Laid-Open Patent Publication No. Sho 61-1083, a Mo layer having a high melting point may be inserted between the Cr/Au layers that constitute the P-type electrode. However, since Mo is not a metal which is very inert, a reaction occurs between the layers of Cr/Mo or between the layers of Mo/Au, with the result that the sheet resistance between the layers of Cr/Mo or between the layers of Mo/Au increases, with the result that the resistance of the electrode as a whole increases inconveniently.

Accordingly, even with the use of the above-described techniques, it is impossible to eliminate the inconvenience of the resulting electrode being unreliable as in the case of the two-layer electrode of Cr/Au.

On the other hand, preferably, the light emission pattern of the far-field image of a high output semiconductor laser element as viewed in the horizontal direction thereof has mono-modality like that which is obtained from a continuous oscillation semiconductor laser element that is used in, for example, a compact disc system. That is, in the continuous oscillation semiconductor laser element, since the stripe width which is a width of contact between the metal electrode into which current is injected and the semiconductor layer is narrow, the far-field image pattern as viewed in the horizontal direction is determined depending on the diffraction effect that results from the stripe width and the oscillation mode also becomes single. However, in the high output semiconductor laser element, it is difficult to obtain such an effect.

However, since the high output semiconductor laser element is arranged to have pulse driving performed with respect thereto by providing an electric current of several tens of amperes to thereby obtain several tens of watts of light output power, it is necessary to have a width of 100 μm or more as the stripe width of the semiconductor laser element.

For this reason, since the light diffraction phenomenon is unlikely to occur definitely, the far-field image as viewed in the horizontal direction does not become stabilized, whereby a bimodality (i.e., a rabbit ear characteristic) is exhibited. In addition, since the stripe width is large as mentioned above, the oscillation mode of the semiconductor laser element becomes multiplex.

SUMMARY OF THE INVENTION

In view of the above problems of the prior art, it is an object of the present invention to provide a high-output semiconductor laser element having an electrode construction which has a high heat resistance, high reliability and long-term stability.

First, the P-type electrode that is constituted by the three layers of Cr/Pt/Au or Cr/Ni/Au is formed as a film on the GaAs substrate. Thereafter, the thus formed P-type electrode is heat treated. In this case, no degradation was observed in the P-type electrode, nor did Cr, Ga and As diffuse into the Au layer to thereby increase the resistance of the electrode.

It has been proved from this that the Pt layer or Ni layer serves as a barrier layer to thereby prevent the diffusion of Ga and As of the GaAs substrate as well as Cr into the Au layer. The reason for this is that the Pt layer or Ni layer does not react with Au at a temperature of approximately 400° C.

On the other hand, when the thickness of the Pt layer or Ni layer was 100 Å or less, each of these layers did not act as a barrier layer, and degradation was observed in the post-heat-treatment electrode with the result that the resistance of the electrode increased. Accordingly, it has been proved that the thickness of the barrier layer consisting of the Pt layer or Ni layer should be 100 Å or more.

FIG. 6 shows the variation in sheet resistance that was exhibited before heat treatment and after heat treatment when the Pt layer thickness of the P-type electrode was varied. As the sample, a Cr layer was formed on the GaAs substrate at a thickness of 300 Å, a Pt layer was formed on the Cr layer, and an Au layer was formed at a thickness of 6000 Å on the Pt layer. Also, in the sample, the thickness of the Pt layer was varied from 0 Å to 1000 Å in steps of 0, 50, 100, 300 and 1000 Å. The experiments were performed such that the sheet resistance of the sample was first measured prior to heat treatment and then was measured after heat treatment that had been performed at 360° C. for 2 minutes. The white circles in FIG. 6 represent the sheet resistance prior to the heat treatment and the black circles represent the sheet resistance after the heat treatment. Also, relative values are used to represent the sheet resistance values.

As is apparent from FIG. 6, when the Pt layer in the P-type electrode is 100 Å or less, the sheet resistance fluctuates a great deal between before and after the heat treatment. Accordingly, it is desirable that the thickness of the Pt layer be at least 100 Å. It is to be noted that although FIG. 6 shows only the thickness of the Pt layer, since Ni exhibits substantially the same properties as Pt in this respect, the use of Ni brings about similar results.

Also, when the thickness of the Cr layer was 100 Å A or less, the Cr layer became islanded, with the result that the Pt or Ni layer was brought into direct contact with the GaAs substrate. For this reason, mutual diffusion occurred between Pt or Ni and Ga and As, with the result that degradation was observed in the electrode. Accordingly, it was proved that the thickness of the Cr layer had to be 100 Å or more.

Also, when the semiconductor laser element was pulse driven with an electric current having a peak value of 10 A or more while the thickness of each of the Cr and Au layers was varied, as long as the resistance of the Cr layer was not more than 150 times as large as that of the Au layer, a large amount of heat was generated from the Cr layer and the electrode was degraded and broken. For this reason, it was proved that the resistance of the Cr layer had to be made at least 150 times as large as that of the Au layer.

It is to be noted that the specific resistance of the Cr layer that has been formed by a vacuum film formation technique is 10 to 30 times as high as that of the Au layer. Therefore, the thickness of the Cr layer must be at least ⅕ or less, preferably ⅟₁₅ or less, of the thickness of the Au layer. Accordingly, considering that usually the thickness of the Au layer is from approximately 1000 Å to approximately 5 µm and the thickness of the Cr layer is 100 Å or more as mentioned above, it is preferable that the thickness of the Cr layer be from 100 Å to 4000 Å.

Next, studies have been made of the relationship between the sheet resistance of the P-type electrode having wires bonded thereto and the far-field image pattern as viewed in the horizontal direction and the results shown in FIGS. 2 to 5 have been obtained. As a result of this, it has been proved that by adjusting the sheet resistance of the P-type electrode, it is possible to adjust the width and shape of the bimodality of the far-field image pattern as viewed in the horizontal direction.

FIG. 2 is a graph illustrating the relative light intensity of the light emission pattern that represents the far-field image pattern as viewed in the horizontal direction of the high output semiconductor laser element, in relation to the light emission angle as viewed in the horizontal direction. In FIG. 2, the width of the bimodal light emission pattern having a relative light intensity of 50% is called "a half-value width". This half-value width becomes an important factor in the laser element.

As is understood also from FIG. 2, the high output semiconductor laser element has bimodality because of a large stripe width. It is to be noted that the height of the recessed portion at the center of the bimodal light emission pattern as measured from the abscissa is called "the bottom height" herein.

According to FIG. 2, when the bottom height of the center of the bimodal light emission pattern is 50% or less, i.e., smaller than the half-value width, the light emission pattern has a configuration wherein the two crests thereof are separated from each other. Accordingly, one laser element has two half-value widths, and there are two layers, with the result that such devices cannot be used as laser elements. For this reason, when approximating the light emission pattern to a mono-modal one, it can be said that the bottom height should be more than 50% (i.e., the half-value width).

FIG. 3 is a graph illustrating the relationship between the sheet resistance of the P-type electrode and the above-mentioned half-value width, the P-type electrode having a stripe width of 400 µm and have wire bondings performed on both sides of the stripe. According to this graph, it is understood that as the sheet resistance becomes large, the half-value width becomes large.

Also, FIG. 4 is a graph illustrating the relationship between the sheet resistance shown in FIG. 3 and the bottom height of FIG. 2. According to this graph, as the sheet resistance becomes large, the bottom height becomes small. Since in the sheet resistance range of 300 mΩ/□ or more the bottom height becomes 50% or less, it is understood that the sheet resistance of the electrode having current injection wire bondings performed thereon should be made to be 300 mΩ/□ or less.

Also, FIG. 5 shows the results of the current distribution at respective positions between both sides of the stripe being simulated with the sheet resistance being used as a parameter. From this graph it is understood that as the position shifts toward both ends of the stripe as viewed in the widthwise direction, the current increases and, as the position approaches the center of the stripe, the current decreases. Also, it is understood that this tendency becomes more prominent as the sheet resistance increases. The reason why when the sheet resistance increases the half-value width increases and conversely the bottom height decreases as mentioned above is because, as illustrated in FIG. 5, the current becomes large on both sides of the stripe and, as the position approaches the center, the current becomes smaller, and this tendency becomes prominent with an increase in the sheet resistance.

That is, in the high output semiconductor laser element, it is necessary to make the stripe width as large as 100 µm or more for the purpose of increasing the output thereof. In this laser element, it is possible to bond wires not on both sides of the stripe but within the stripe. However, in this case, when performing the wire bonding, damage is sometimes caused to the active layer for emitting laser light, thereby deteriorating the semiconductor laser element. For this reason, it is necessary to connect the current injection electrode from both sides of the stripe corresponding to the active layer by wire bonding or the like. In this element, since as the position shifts toward the center between the P-type electrodes, i.e., the center of the stripe, the current value becomes smaller due to the sheet resistance of the P-type electrode, the amount of current injected becomes smaller at the center of the stripe and in the vicinity thereof with the result that the light emission pattern of the far-field image as viewed in the horizontal direction has undesirable bimodality.

Accordingly, in an arrangement wherein current injection is performed not from the center of the stripe but from both sides thereof, as mentioned above, decreasing the sheet resistance of the P-type electrode enables shift of the light emission pattern of the far-field image as viewed in the horizontal direction thereof from bimodality to mono-modality. Accordingly, forming the P-type electrode of the high output semiconductor laser element into the Cr/Pt/Au or Cr/Ni/Au structure and thereby suppressing the sheet resistance to a small value enables the enhancement of the laser emission characteristics. Further, in order to obtain the mono-modality reliably, it is preferable from FIG. 5 that the sheet resistance of the P-type electrode be 300 mΩ/□ or less.

Also, even in a case where a three-layer electrode of Ti/Pt/Au or Ti/Ni/Au has been adopted as the P-type electrode instead of the three-layer electrode of Cr/Pt/Au or Cr/Ni/Au, it has been proved that the sheet resistance can be suppressed to be small as in the case of the three-layer structure of Cr/Pt/Au or Cr/Ni/Au. Accordingly, in this case it is also possible to achieve the improvement in the horizontal far-field image. Also, in this case as well, it is preferable that the sheet resistance of the wire-bonded electrode be made 300 mΩ/□ or less as in the case of the three-layer electrode of Cr/Pt/Au or Cr/Ni/Au.

In view of the above, in order to cope with the above-mentioned circumstances, the present invention has an object of providing a high output semiconductor laser element having an electrode construction which has a high heat resistance and reliability and long-term stability by utilizing one of the Cr/Pt/Au electrode and the Cr/Ni/Au electrode as the P-type electrode, or by using one of the Ti/Pt/Au electrode and Ti/Ni/Au electrode as the P-type electrode.

Also, the present invention has another object of providing a high output semiconductor laser element wherein the bimodality of the far-field pattern as viewed in the horizontal direction is adjusted by decreasing the sheet resistance of the power supply side electrode and thereby is approximated to mono-modality.

The above objects are achieved according to a first aspect of the present invention by providing a semiconductor laser element in which the P-type electrode is constituted by a three layer electrode that consists of either Cr/Pt/Au or Cr/Ni/Au. As a result of this, the Pt layer or Ni layer serves as a bimetallic layer with respect to the diffusion of Cr or substrate components into the Au layer to thereby suppress any increase in the resistance that follows the heat treatment that succeeds the formation of the P-type electrode. As a result, and it is possible to provide a high output semiconductor laser element which has an electrode construction that is robust with respect to heat, high in reliability and stable for a long period of time.

Also, it is preferable that the thickness of the Cr layer is in the range of 100 Å to 4000 Å so that the above-mentioned role of the Pt layer or Ni layer as a bimetallic layer is further enhanced, and that the sheet resistance of the Cr layer is at least 150 times as large as that of the Au layer. In this way, it is possible to suppress the amount of heat generated in the Cr layer and to suppress the degradation of the electrode to thereby prevent the inconvenience of the electrode being broken.

Further, it is preferable that the thickness of the Pt layer or Ni layer is 100 Å or more so that it is possible to suppress the increase in the sheet resistance. Moreover, it is further preferable that the P-type electrode is formed on an insulation member at both sides of the stripe and current injection is performed from the P-type electrode on both sides of the insulation member, where the semiconductor laser element has a large stripe width. In this way, since the sheet resistance value of the P-type electrode can be decreased, it is possible to change the light emission pattern of the far-field image as viewed in the horizontal direction from the bimodality to the mono-modality.

It is also preferable that the sheet resistance of the P-type electrode is 300 mΩ/□ or less to reliably change to the mono-modality the light emission pattern of the far-field image as viewed in the horizontal direction of the semiconductor laser element, and it is also preferable that a P-type electrode (40) having a stripe width (41) of 100 μm or more is constituted by a three layer electrode that consists of either Ti/Pt/Au or Ti/Ni/Au and that the P-type electrode (40) has a stripe width (41) of 100 μm or more, where current injection is performed from both sides of the stripe and the sheet resistance of the P-type electrode is 300 mΩ/□ or less. In this way, it is possible to reliably change the light emission pattern of the far-field image as viewed in the horizontal direction from the bimodality to mono-modality.

It is possible that the semiconductor laser element is in the form of a mesa structure and the depth of this mesa structure is larger than a depth that corresponds to a light emission layer that emits laser light. In this way, it is possible to protect the light emission layer from damage that might occur in the element forming step. That is, since the stripe width of the high output semiconductor laser element is as large as 100 μm or more, the semiconductor laser is likely to be damaged by the process step. Accordingly, by shortening the element structure into a mesa type structure and thereby making the light emission layer close to the stripe width, it is possible to protect the light emission layer from the damage that might occur in the process step. Also, by shortening the light emission layer by forming it into a mesa type structure, the current that flows in from the stripe is prevented from spreading uselessly into the whole light emission layer, and the light emission efficiency with respect to the injected current is not lowered.

Also, it is possible that a plurality of the semiconductor laser elements are stacked together. In such structures, the N-type electrode of one semiconductor element is generally bonded onto the P-type electrodes of another by brazing filler metal such as solder. However, when the P-type electrode is of a conventional type, Cr, Ga, As, etc. are diffused to become impurities of Au, whereby the wetting between the P-type electrode and the solder deteriorates with the result that there occur regions where no bond is effected. As a result, in the semiconductor laser that constitutes a lower layer, injection of current becomes uneven, and the light emission pattern becomes uneven. In view of this, by providing Pt or Ni between Cr and Au or between Ti and Au, it is possible to prevent the diffusion of Cr, Ga, As, etc. into Au and thus prevent the deterioration of the wetness between the P-type electrode and the solder material.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

Figure 1:
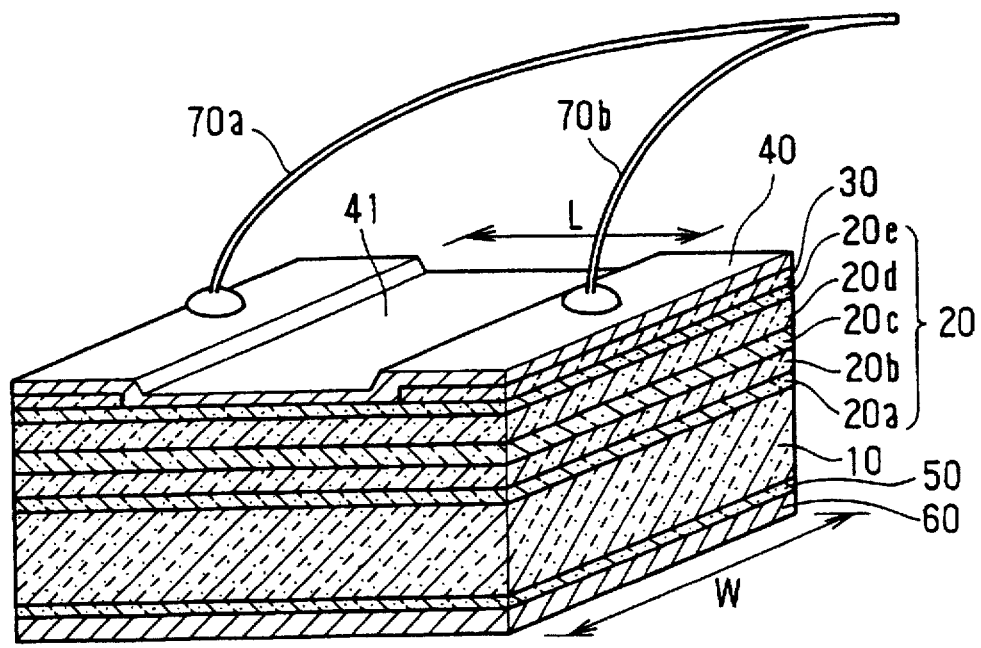
FIG. 1 is a perspective view of a semiconductor laser element according to a first preferred embodiment of the present invention.
Figure 2:
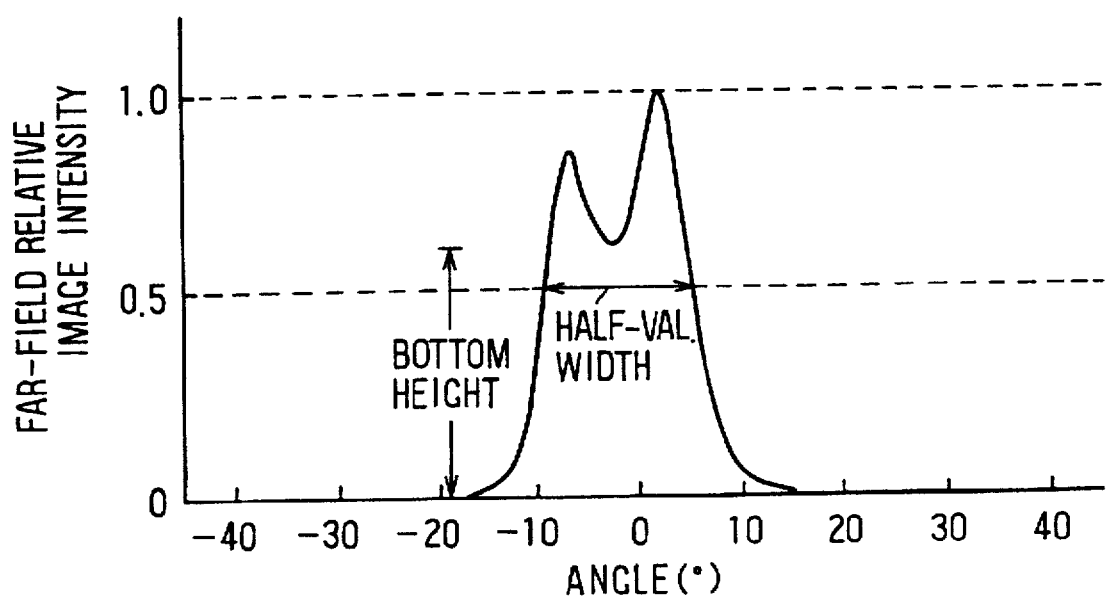
FIG. 2 is a graph of the relative light intensity of the light emission pattern of a far-field image as viewed in the horizontal direction of the semiconductor laser element versus the light emission angle in the first embodiment.
Figure 3:
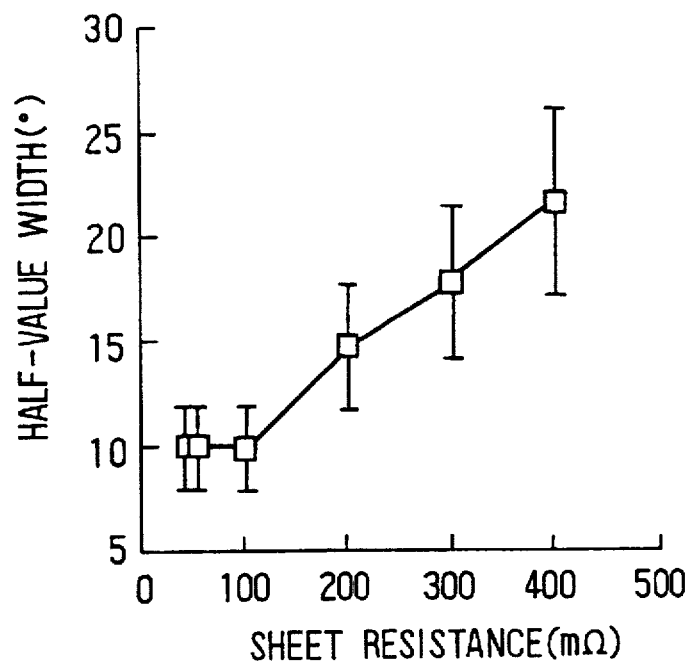
FIG. 3 is a graph of the half-value width shown in FIG. 2 versus the sheet resistance in the first embodiment.
Figure 4:
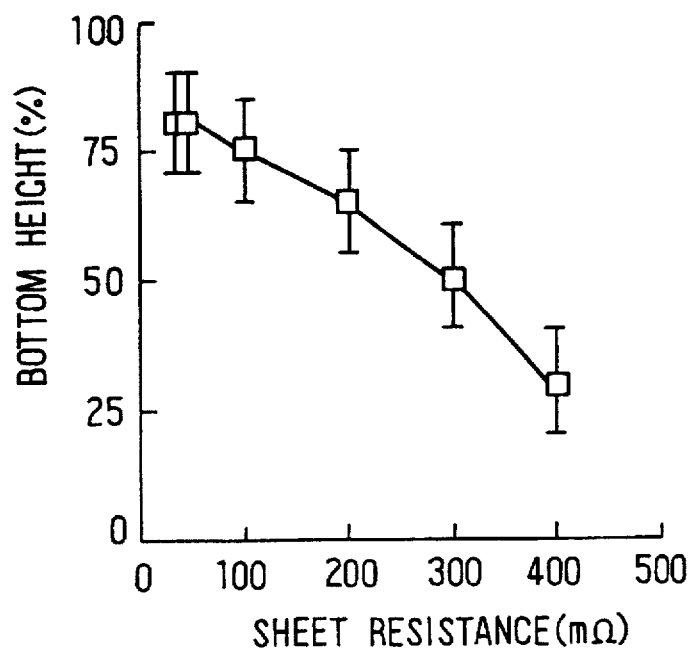
FIG. 4 is a graph of the bottom height shown in FIG. 1 versus the sheet resistance in the first embodiment.
Figure 5:
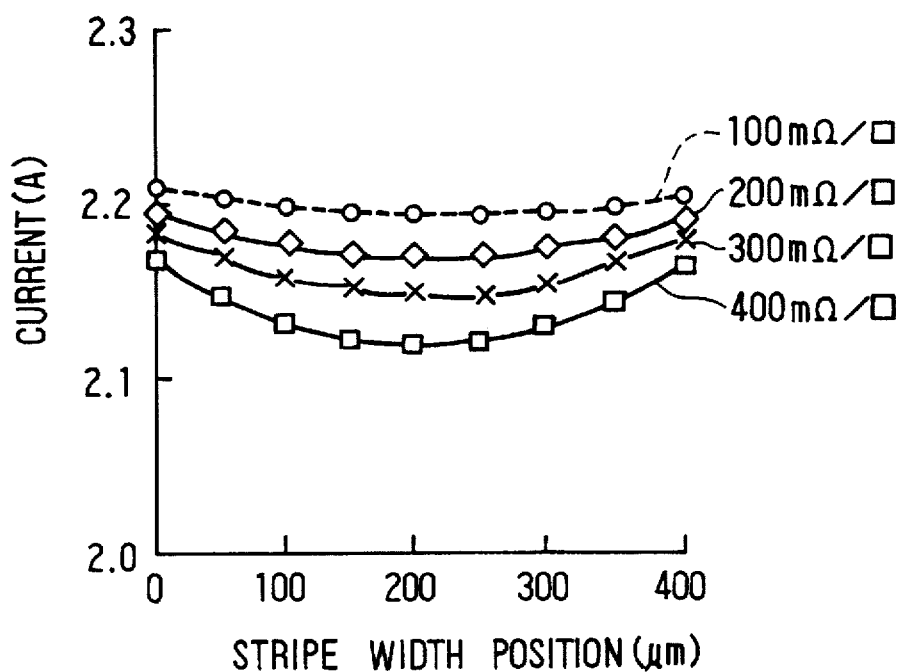
FIG. 5 is a graph illustrating change in the current injected into the semiconductor laser element according to the within-stripe positions of the semiconductor laser element with the sheet resistance being taken as a parameter according to the first embodiment.
Figure 6:
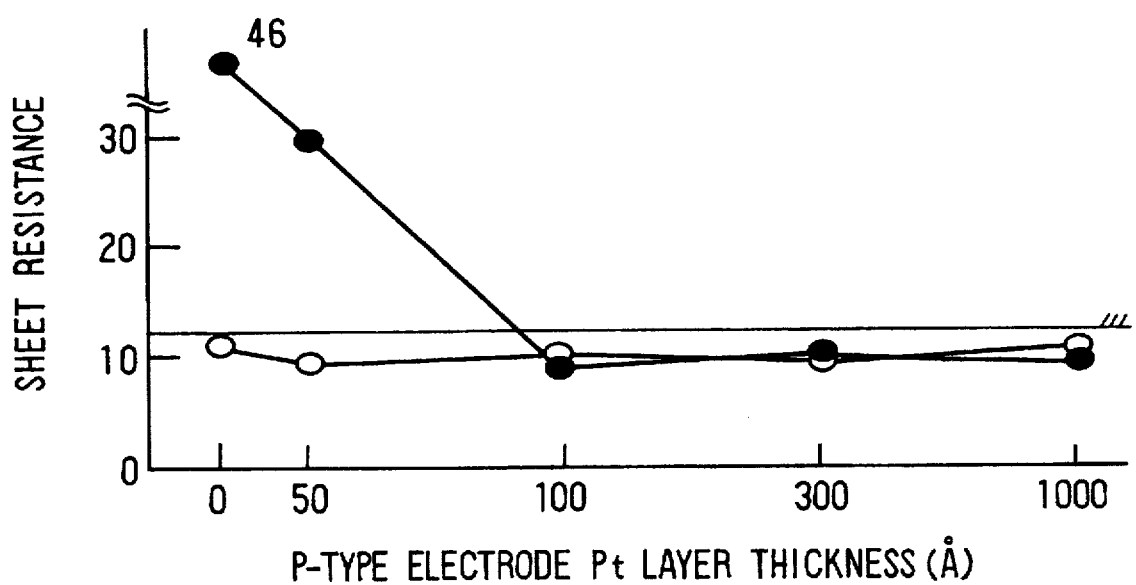
FIG. 6 is a graph of the thickness of the Pt layer versus the sheet resistance according to the first embodiment.

A first preferred embodiment of the present invention will be explained hereafter with reference to FIG. 1. In this semiconductor laser element, an epitaxial layer 20 that is composed of an N-type clad layer 20a, a light guide layer 20b, a light emitting layer 20c, a P-type light guide layer 20d and a clad layer 20e is stacked on the surface of an N-type substrate 10, as well as an insulation layer 30 and a P-type electrode 40 while, on the other hand, an N-type electrode 50 and a solder layer 60 are disposed on a rear surface of the N-type substrate 10, whereby current injection wires 70a and 70b are bonded on opposite sides of a stripe 41.

In the epitaxial layer 20, the light emitting layer 20c is set to have the highest refractive index and the light guide layer 20b and the clad layer 20e are set to have progressively lower refractive indices. As a result of this, it is possible to confine light within the light emitting layer 20c.

The P-type electrode 40 consists of a three-layer film that is composed of Cr/Pt/Au or Cr/Ni/Au. This P-type electrode 40 has the stripe 41 having a width L (referred to as "the stripe width L") formed therein, and the P-type electrode 40 is bonded directly to the epitaxial layer 20 and is used for current injection.

In this embodiment, the stripe width L is set to be 100 μm or more for the purpose of providing a high output. In order to prevent the Pt layer or Ni layer from directly contacting the substrate 10 as mentioned above, the thickness of the Cr layer of the P-type electrode 40 is set to be 100 Å or more.

In order to suppress the amount of heat generated from the Cr layer as mentioned above, the sheet resistance of the Cr layer is set to be at least 150 times as large as that of the Au layer. Also, in order to ensure the above-mentioned role of the Pt or Ni layer as a barrier metal with respect to the Au layer, the thickness of the Pt or Ni layer is set to be 100 Å or more. Further, in order to make the bimodality of the horizontal far-field image substantially mono-modal as mentioned above, the sheet resistance of the P-type electrode 40 is set to be 300 mΩ/□ or less.

Next, a method for manufacturing the above-described semiconductor laser element will be explained.

First, the N-type substrate 10 is prepared. A GaAs AlGaAs system, InGaAsP-InP system or InGaP-InGaAlP system material may be used as the material of this N-type substrate 10. Further, an epitaxial layer 20 that consists of the N-type clad layers 20a and 20b, light emitting layer 20c and P-type clad layers 20d and 20e is epitaxially grown on the surface of this N-type substrate 10.

It is to be noted that various techniques such as liquid layer epitaxy, molecular beam epitaxy and metal organic gas phase epitaxy may be used as the epitaxial growth method. Also, a double heterostructure, quantum well structure, or the like may be used as the epitaxial layer 20 structure, i.e., active layer structure.

After the formation of the epitaxial layer 20, the insulation layer 30 is formed on the surface of this epitaxial layer 20. The ohmic contact electrode is formed as follows. First, the P-type electrode 40 is formed as a three-layer structure of Cr/Pt/Au or Cr/Ni/Au by an electron beam deposition technique, sputtering technique, or the like to a prescribed thickness.

Next, where patterning is to be performed, processing is executed in a prescribed pattern by the use of photoresist processing, chemical etching or ion beam etching. Since the P-type electrode 40 is an electrode having wire bondings performed with respect thereto, the sheet resistance of this P-type electrode 40 is 300 mΩ/□ or less.

Next, in order to facilitate cleaving the chips from the semiconductor wafer, the rear surface of the substrate 10 is polished to thereby make the wafer thickness approximately 100 μm. It is sufficient that this thickness be approximately ⅓ or less of the cavity length W (i.e., resonance length W). Although this cavity length W is generally in the range of 300 μm to 1 mm, since the smaller the wafer thickness the more excellent the heat radiation, the wafer thickness is made to be from 50 μm to 200 μm with the processability also taken into consideration. It is to be noted that the wafer thickness is not restricted to this in the case of fabricating the reflective surface by dry etching with the use of no cleavage surface.

Next, the N-type electrode 50 is formed on the rear surface of the substrate 10 by electron beam deposition or sputtering to a prescribed thickness. It is possible to use, for example, a three-layer film of Au—Ga/Ni/Au or a two-layer film of Au—Sn/Au as this N-type electrode 50. After the formation of the film, alloying is performed and the resulting film is formed as the N-type electrode.

Subsequently, the solder layer 60 is formed on the rear surface of the N-type electrode 50. It is to be noted that in a case where a thin film prepared by gas phase growth is used as this solder layer 60, the thin film is formed by electron beam deposition, resistance heat deposition or sputtering.

Au—Sn, Au—Si, In, Pb, Pb—Sn, Au—Pb or Au—Ge may be used as the material of the solder layer 60.

Thereafter, division of the semiconductor wafer into chips is performed after processing the wafer to a prescribed thickness. At this time, since unless the emission surface of laser light is a mirror surface no laser oscillation occurs, the emission surface is made into a cleavage surface or otherwise the light emitting end face is made up by dry etching. Regarding the light emission end faces, in order to achieve the end-face protection and the increase in the light output efficiency, a low-reflection film is provided on the output end face and a high-reflection film is provided on the other end face. It is preferable that the reflectance of each film be approximately from 2% to 25% in the case of the low-reflection film and, in the case of the high-reflection film, be approximately from 80% to 100%. $Al_2O_3$ or $SiO_2$ film can be used as the low-reflection film, and a stacked film of $Al_2O_3$/a-Si/$Al_2O_3$/a-Si can be used as the high-reflection film.

The reflection film may be a single-layer film, multi-layer film or a film having any other appropriate construction. However, regarding the high reflection film, it is preferable that it be a multi-layer film that is composed of $Al_2O_3$, $SiO_2$, $SiN_x$, SiC, C, $Cr_2O_3$, $TiO_2$ or the like between which there exist differences in refractive index.

It is to be noted that the reflection film can be formed by deposition or sputtering.

The thus-formed fabricated semiconductor laser chip is bonded to a heat sink, another semiconductor substrate, a circuit board or the like to thereby perform mounting (e.g., by die bonding). Subsequently to the die bonding, in order to make electric contact with a semiconductor laser element, the above-mentioned electrode and the drive circuit wiring are bonded to each other by wires such as Au, Pt or the like. At this time, the wire bondings are respectively performed with respect to both sides of the stripe. This is because wire bonding within the stripe causes damages to the active layer, thereby deteriorating the element. Thereafter, the resulting structure is sealed within a can.

A concrete fabrication example of this embodiment will be explained below.

A semiconductor laser element of GaAs/AlGaAs was fabricated on an n-GaAs substrate. The size of the semiconductor laser element was 500 μm×800 μm×110 μm and the stripe width was 300 μm. An electrode of Cr/Pt/Au whose Cr, Pt and Au layers were 300 Å, 1000 Å and 6000 Å thick, respectively was used as the P-type electrode.

At this time, the sheet resistance of the Au layer was 50 mΩ/□ and the sheet resistance of the Cr layer was 30 Ω/□. The sheet resistance of the Cr layer is 600 times as large as that of the Au layer. The sheet resistance of the Cr/Pt/Au electrode of this element was 50 mΩ/□ and, even after heat treatment was performed at 360° C. for was minutes, was not changed whatsoever.

Next, when this element was die bonded and driven and the horizontal far-field image was measured, and the bottom height of the recessed portion at the center of the bimodal distribution was 85% with a half-value width of 10°.

Another concrete fabrication example of this embodiment is described below.

A semiconductor laser element in the GaAs/AlGaAs system was fabricated on an n-GaAs substrate. The size of this semiconductor element was made to be 500 μm×800 μm×110 μm and the stripe width was made to be 400 μm. A Cr/Ni/Au electrode whose Cr, Ni and Au layers were 500 Å, 500 Å and 8000 Å thick, respectively was used as the P-type electrode.

At this time, the sheet resistance of the Au layer was 40 mΩ/□ and the sheet resistance of the Cr layer was 18 Ω/□. The sheet resistance of the Cr layer is 450 times as large as that of the Au layer. The sheet resistance of the Cr/Ni/Au electrode of this element was 40 mΩ/□ and, even after heat treatment performed at 360° C. for two minutes, was not changed whatsoever.

Next, when this element was mounted and driven and the horizontal far-field image was measured, the bottom height of the recessed portion at the center of the bimodal distribution pattern was 85% with a half-value width of 9°.

Next, a modification of the above-mentioned embodiment form will be explained.

In this modification, a semiconductor laser element in the InGaP-InGaAlP system was fabricated on an n-GaAs substrate. The size of this semiconductor laser element was made to be 600 μm×700 μm×110 μm and the stripe width was made to be 250 μm. Also, a Ti/Pt/Au electrode whose Ti, Pt and Au layers were 1000 Å, 2000 Å and 4000 Å thick, respectively, was used as the P-type electrode and the Pt and Au layers Were formed sequentially on the Ti layer using an electron beam deposition technique. At this time, the sheet resistance of the Ti/Pt/Au electrode of this element is 90 mΩ/□.

When this element was mounted and driven and the horizontal far-field image was measured, the bottom height of the recessed portion at the center of the bimodal distribution was 80% with a half-value width of 10°. As a result of this, it is possible to achieve the improvement in the horizontal far-field image as in the case of adopting the Cr/Pt/Au electrode as the P-type electrode.

Figure 7:
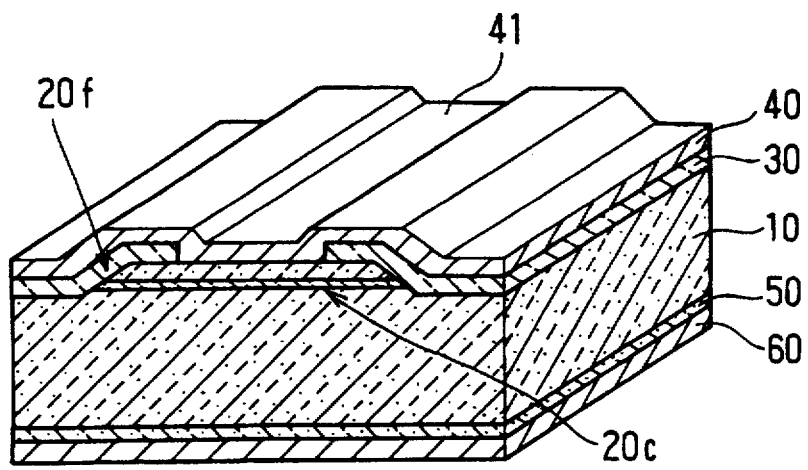
FIG. 7 is a perspective view of a semiconductor laser element according to a second embodiment of the present invention.

Next, FIG. 7 shows a semiconductor laser element having a mesa structure according to a second preferred embodiment of the present invention. The components having structures similar to those shown in FIG. 1 are denoted by the same reference numerals, as is the case with the other embodiments described below.

In the semiconductor laser element shown in FIG. 7, a structure similar to the epitaxial layer 20 shown in FIG. 1 is stacked on the surface of the substrate 10 (note, however, that in FIG. 7 only the light emitting layer 20c is shown). An etching mask such as resist is formed by executing a known photolithography step and isotropic etching is performed to thereby enable the formation of a mesa 20f. A mixed solution of $H_2O_2$ and $H_3PO_4$ may be used as the isotropic etching solution for GaAs. The succeeding steps can be executed in the same way as in the case of the above-mentioned method. It is to be noted that although not illustrated, in this structure also, wire bonding is performed with respect to the P-type electrode 30 on the insulation layer 30.

As illustrated in FIG. 7, by making up the high output semiconductor laser element into a mesa structure and further making the depth of the mesa larger than that of the light emitting layer 20c, this light emitting layer 20c can be protected from damages that might occur during the formation steps. Whereas the stripe width of the semiconductor laser element that is conventionally used for a compact disc or the like is 10 μm or less, the high output semiconductor laser element has a stripe width of 100 μm or more. For this reason, the laser element is liable to incur the adverse effect of the damages that occur during the formation steps. Therefore, the element structure is made into a mesa and the length of the light emitting layer 20c is thereby approximated to the stripe width to thereby enable the protection of the semiconductor laser element from damage. This structure is effective particularly in the high output semiconductor laser element as stated previously.

Further, since by making a mesa structure it is possible to decrease the leakage current that diffuses from the stripe 41 in the lateral direction of the light emitting layer 20c and that does not contribute to laser light emission, it is possible to suppress a decrease in light emitting efficiency with respect to current injection.

Figure 8:
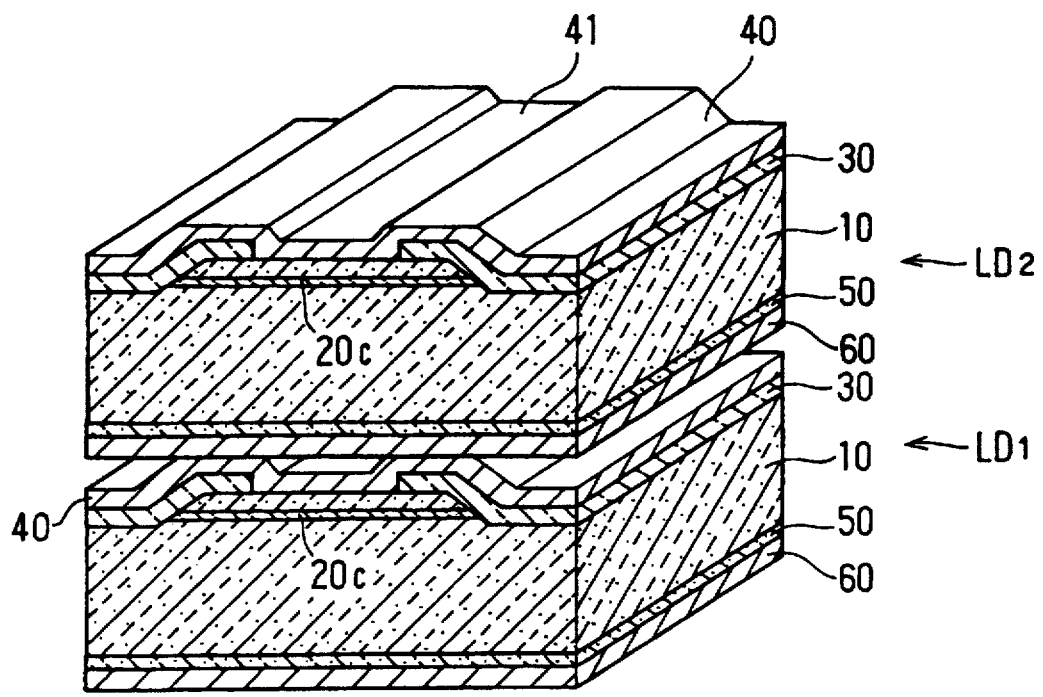
FIG. 8 is a perspective view of a semiconductor laser element according to a third embodiment of the present invention.

Next, a third preferred embodiment of the present invention is shown in FIG. 8. This semiconductor laser element is one which is prepared by stacking the semiconductor laser elements LD1 and LD2 having mesa structures as illustrated in FIG. 7. This laser device may also be prepared by stacking the semiconductor laser elements illustrated in FIG. 1 as illustrated in FIG. 8. Each of these separate stacked elements can be understood to be a semiconductor laser element unit as recited in the appended claims.

Stacking of the semiconductor lasers elements LD1 and LD2 is performed by placing the laser element LD2 on the P-type electrode 40 of the element LD1 and melting the solder layer 60 of the element LD2 at a temperature of approximately 350° C. and thereby bonding the elements to each other. It is to be noted that the other structure components such as bonding wires are the same as those shown in each of the above-mentioned embodiments.

In the stacked structure where two or more elements are stacked one upon the other as shown in FIG. 8, current injection from the upper to the lower semiconductor laser element becomes an important problem. Namely, when current injection from the upper to the lower semiconductor laser element is bad, the light emission intensity distribution of the lower semiconductor laser element becomes inferior, and as an important factor that affects the current injection from the upper to the lower semiconductor laser element there can be cited the bond quality between the lower side P-type electrode and the upper side solder layer.

That is, when the bond between the lower side P-type electrode and the upper side solder layer is poor, the current injection from the upper side to the lower side becomes uneven, and the light emission pattern also becomes uneven.

Further, while it is the problem of wetness of solder that affects the state of the bond between the lower side P-type electrode and the upper side solder layer, when the P-type electrode is of a conventional type, Cr, Ga, As and the like diffuse to become impurities of Au, with the result that the wetness characteristic between the P-type electrode and the solder deteriorates, and non-bonded regions occur. Accordingly, by providing Pt or Ni between Cr and Au or between Ti and Au as disclosed above, diffusion of Cr, Ga, As and the like into Au can be prevented, whereby the surface of the P-type electrode is maintained in a state of pure gold. Therefore, at the bond between the elements, the reaction becomes uniform, with the result that formation of a uniform bond becomes possible. As a result of this, since the bonding becomes uniform, current injection from the upper side to the lower side semiconductor laser element also becomes uniform and the light emission pattern is stabilized.

Although the present invention has been fully described in connection with the preferred embodiment thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A semiconductor laser element comprising: an N-type electrode;
    a P-type electrode having a stripe width of at least 100 µm;
    an active element disposed between said N-type electrode and said P-type electrode;
    an insulation member disposed between said P-type electrode and said active element;
    a pair of current supplying portions, each being directly connected to and directly supplying current to a portion of said P-type electrode on a respective side thereof;
    wherein said P-type electrode includes a three-layer structure including a first layer selected from the group consisting of a Cr layer and a Ti layer; an Au layer; and a layer selected from the group consisting of a Pt layer and an Ni layer disposed therebetween;
    said P-type electrode is disposed on said insulation member at both sides of a stripe thereof; and
    said active element is for receiving current injection from said P-type electrode on both sides of said insulation member.

2. The semiconductor laser element of claim 1, wherein a thickness of said Cr layer is in a range of 100 Å to 4000 Å.

3. The semiconductor laser element of claim 1, wherein a thickness of said Pt layer is at least 100 Å.

4. The semiconductor laser element of claim 1, wherein a thickness of said Ni layer is at least 100 Å.

5. The semiconductor laser element of claim 1, wherein a sheet resistance of said P-type electrode is not greater than 300 mΩ/□.

6. The semiconductor laser element of claim 1, wherein: said semiconductor laser element has a mesa structure; and
    said mesa structure is deeper than said active element.

7. The semiconductor laser element of claim 1, further comprising:
    a substrate;
    wherein said active element includes a light emission layer disposed on a surface of said substrate thereof;
    said P-type electrode is disposed on said light emission layer;
    said N-type electrode is disposed on a rear surface of said substrate;
    said substrate, said light emission layer and said P-type and said N-type electrode constituting a semiconductor laser element unit;
    said semiconductor laser element further comprises at least one additional semiconductor laser element unit stacked together;
    wherein P-type electrodes and N-type electrodes of adjacent semiconductor laser element units are bonded to each other with solder.

8. The semiconductor laser element of claim 7, wherein:
    said semiconductor laser element has a mesa structure; and
    said mesa structure is deeper than said active element.

9. A semiconductor laser element comprising:
    an N-type electrode;
    a P-type electrode having a stripe width of at least 100 µm; and
    an active element disposed between said N-type electrode and said P-type electrode;
    wherein said P-type electrode includes a three-layer structure including a first layer selected from the group consisting of a Cr layer and a Ti layer; an Au layer; and a layer selected from the group consisting of a Pt layer and an Ni layer disposed therebetween; and
    a thickness of said Au layer is in a range of 100 Å to 5 µm.

10. A semiconductor laser element comprising:
    an N-type electrode;
    a P-type electrode having a stripe width of at least 100 µm; and
    an active element disposed between said N-type electrode and said P-type electrode;
    wherein said P-type electrode includes a three-layer structure including a first layer selected from the group consisting of a Cr layer and a Ti layer; an Au layer; and a layer selected from the group consisting of a Pt layer and an Ni layer disposed theretetween; and
    a sheet resistance of said Cr layer is at least 150 times greater than that of said Au layer.

11. A semiconductor laser element comprising:
    an N-type electrode;
    a P-type electrode having a stripe width of at least 100 µm, a sheet resistance of said P-type electrode being not greater than 300 mΩ/□;
    an active element disposed between said N-type electrode and said P-type electrode;
    an insulation member disposed between said P-type electrode and said active element; and
    an insulation member disposed between said P-type electrode and said active element;
    wherein said active element is for receiving current injection from said P-type electrode on both sides of said insulation member;
    said P-type electrode is disposed on said insulation member at both sides of a stripe thereof;
    said semiconductor laser element further comprises a pair of current supplying portions, each being directly connected to and directly supplying current to a portion of said P-type electrode on a respective side thereof; and
    said active element is for receiving current injection from said P-type electrode on both sides of said insulation member.

12. The semiconductor laser element of claim 11, further comprising:

a substrate;

wherein said active element includes a light emission layer disposed on a surface of said substrate thereof;

said P-type electrode is disposed on said light emission layer;

said N-type electrode is disposed on a rear surface of said substrate;

said substrate, said light emission layer and said P-type and said N-type electrode constituting a semiconductor laser element unit;

said semiconductor laser element further comprises at least one additional semiconductor laser element unit stacked together;

wherein P-type electrodes and N-type electrodes of adjacent semiconductor laser element units are bonded to each other with solder.

13. A semiconductor laser element comprising:

a first electrode;

an active element disposed on said first electrode;

insulation members disposed on said active element, said insulation members being at both sides of an opening for exposing an electric current receiving region of said active element;

a second electrode on said insulation members and on said electric current receiving region at said opening;

a first current supplying portion, connected to said second electrode, stacked on one of said insulation members on a side of said opening; and a second current supplying portion, connected to said second electrode, stacked on a different side of said insulation members on a side of said opening.

14. The semiconductor laser element of claim 13, wherein the width of said exposed electric current receiving region is at least 100 μm.

15. The semiconductor laser element of claim 13, wherein said second electrode has a three-layer structure including a first layer selected from the group consisting of a Cr layer and a Ti layer; an Au layer; and a layer selected from the group consisting of a Pt layer and an Ni layer disposed therebetween.

* * * * *